(12) United States Patent
Darabi (10) Patent No.: US 7,120,411 B2
(45) Date of Patent: Oct. 10, 2006

(54) LOW NOISE AMPLIFIER (LNA) GAIN SWITCH CIRCUITRY

(75) Inventor: Hooman Darabi, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 352 days.

(21) Appl. No.: 10/138,601

(22) Filed: May 3, 2002

(65) Prior Publication Data

US 2003/0181181 A1 Sep. 25, 2003

Related U.S. Application Data

(60) Provisional application No. 60/367,904, filed on Mar. 25, 2002.

(51) Int. Cl.
*H04B 1/06* (2006.01)
(52) U.S. Cl. ............... 455/240.1; 455/293; 455/251.1; 375/345; 330/254
(58) Field of Classification Search ............. 455/232.1, 455/234.1, 240.1, 241.1, 242.2, 245.1, 250.1, 455/280, 293, 242.1–2, 251.1; 330/252–254, 330/257, 285; 375/345
See application file for complete search history.

(56) References Cited

U.S. PATENT DOCUMENTS

| | | | | |
|---|---|---|---|---|
| 4,055,129 A | * | 10/1977 | Hunts et al. ............... 112/453 |
| 5,619,152 A | * | 4/1997 | Holtvoeth et al. .......... 327/110 |
| 5,675,278 A | * | 10/1997 | Tanaka et al. .............. 327/333 |
| 6,038,145 A | * | 3/2000 | Jacobs et al. ................. 363/20 |
| 6,218,903 B1 | * | 4/2001 | Hashimoto et al. ......... 330/277 |
| 6,292,032 B1 | * | 9/2001 | Hirabayashi et al. ......... 327/67 |
| 6,633,441 B1 | * | 10/2003 | Cheng et al. ................. 360/31 |
| 6,731,171 B1 | * | 5/2004 | Yamashita ................... 330/285 |
| 6,753,730 B1 | * | 6/2004 | Yamamoto ................... 330/253 |
| 6,774,300 B1 | * | 8/2004 | McFarland .................. 136/255 |

* cited by examiner

Primary Examiner—Nguyen T. Vo
Assistant Examiner—Nhan T. Le
(74) Attorney, Agent, or Firm—Garlick Harrison & Markison; James A. Harrison (57) ABSTRACT

A circuit is formed to steer current in and out of an inductive load in a manner that enables an amplifier to provide a plurality of gain steps without modifying an LC time constant for the circuit and, therefore, without modifying the tuning or frequency of oscillation for the circuit. A first group of MOSFETs are coupled in parallel and define the circuit current flow. A second group of MOSFETs are coupled in parallel to each other and in series to an impedance device. A third group of MOSFETs coupled to steer current in and out of the impedance device to affect the output signal coupled to one end of the impedance device. The transistors in the second and third groups of MOSFETs are selectively activated to control the amount of current that goes through the impedance device.

25 Claims, 7 Drawing Sheets

LOW NOISE AMPLIFIER (LNA) GAIN SWITCH CIRCUITRY

CROSS-REFERENCE TO RELATED APPLICATIONS

This application claims priority to and incorporates by reference U.S. Provisional Application entitled, "Method and Apparatus for a Radio Transceiver" having a Ser. No. 60/367,904 and a filing date of Mar. 25, 2002, and the Utility Patent Application filed concurrently herewith entitled, "LNA Gain Adjustment for Intermodulation Interference Reduction" by the inventors Hooman Darabi and John Leete, having a U.S. Pat. No. 6,961,552 and a issuance date of Nov. 1, 2005.

BACKGROUND

1. Field of the Invention

This invention relates generally to wireless communications and, more particularly, to the operation of a Radio Frequency (RF) transceiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscribers' subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF transceivers. Radio frequency transceivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts it to IF and then to baseband. In other systems, the received RF is converted directly to baseband.

Radio receivers typically include several circuits that each provide an amount of gain to the received signals. For example, mixers and low pass filters each often provide gain. Because, however, the signal strength of a received signal can vary significantly, there is a need for amplifiers within the radio receiver whose gain level is adjustable. Programmable amplifiers often vary a feedback resistance value to adjust gain. Typically, a low noise amplifier is used to amplify the received signal prior to mixing it with a local oscillator. The level of amplification provided, however, must often be adjusted to compensate for fluctuations in received signal strengths.

Figure 1A:
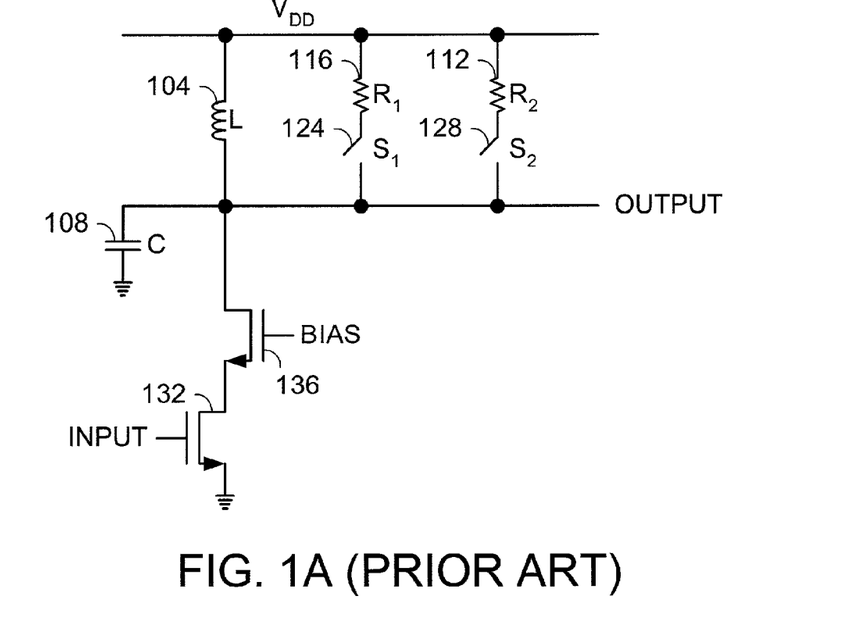
FIG. 1A is a functional schematic diagram of a variable gain amplifier formed according to a known prior art design.

FIG. 1A is a functional schematic diagram of a variable gain amplifier formed according to a known prior art design. The amplifier of FIG. 1A includes tuned circuitry with components selected to resonate at a specified frequency. Thus, as may be seen, the circuitry includes an inductive load 104 that is substantially coupled in series to a capacitive load 108. Further, a first resistive load 112 and a second resistive load 116 are coupled in parallel to inductive load 104. As may be seen, each of the resistive loads 112 and 116 are coupled in series to switches 124 and 128, respectively, for coupling or decoupling resistive loads 112 and 116 from being connected in parallel to inductive load 104.

Additionally, as may be seen, a MOSFET 132 is coupled to receive an input signal at its gate and is coupled in series with an additional isolation MOSFET 136 that is for providing isolation between MOSFET 132 and the load and tuning components described already. Thus, the use of isolation MOSFET 136 prevents MOSFET 132 from oscillating instead of amplifying a signal. MOSFET 136 is often referred to a Cascode device.

One drawback to the design of FIG. 1A is that the addition of resistive loads 112 and 116, especially if MOSFETs are used as resistors, is that the total capacitance of the circuit is modified each time a MOSFET resistor is turned on or turned off. Accordingly, if a circuit with inductive load 104 is tuned with capacitive load 108, the modification of the total network capacitance by the addition of new MOSFET resistors, or removal of MOSFET resistors, causes the tuning frequency to drift slightly. There is a need, therefore, for a circuit that enables resistive loads to be added or removed from the circuit to modify the circuit gain without affecting the oscillation frequencies or tuning of the circuit.

Figure 1B:
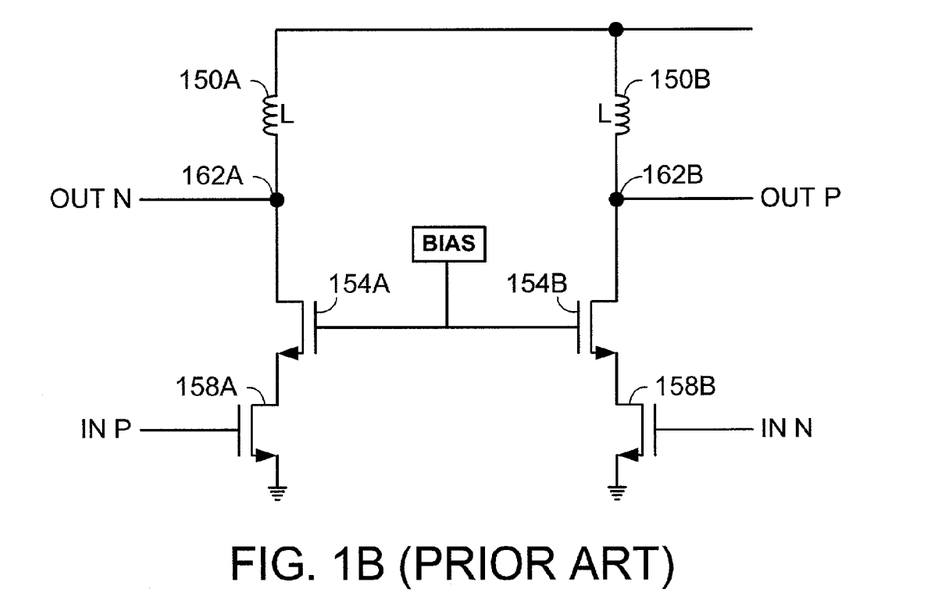
FIG. 1B is a functional schematic diagram of a differential prior art amplifier.

FIG. 1B is a functional schematic diagram of a differential prior art amplifier. As may be seen, the differential amplifier of FIG. 1B includes inductive loads 150A and 150B, isolation MOSFETs 154A and 154B, and a pair of amplification MOSFETs 158A and 158B. Isolation MOSFETs 154A and 154B have their gates coupled together so that current in one branch is reflected in the other branch. Amplification MOSFET 158A is for receiving a first portion of a signal input at its gate, while amplification MOSFET 158B is for receiving a second portion of a signal for amplification at its gate. The amplified signal produced by amplification MOSFET 158A results in a signal output at a node 162A, while the input of amplification MOSFET 158B results in an output signal being produced at a node 162B.

The operation of cascode differential amplifiers, such as shown in FIG. 11B, are known. The amplifier of FIG. 1B is shown to illustrate a typical configuration for the purposes of better explaining the described embodiments of the present invention. More specifically, the figures herein that describe the invention illustrate only one-half of a differential amplifier pair so as to simplify the explanation and make the operation more clear to understand. It is understood, however, that the invention described herein may readily be formed as a differential amplifier for amplifying positive and negative signals.

The inventors have realized, however, that adding or removing loading elements formed within integrated circuit radios (e.g., MOSFETs operating in a linear region as resistive loads) to change the amplifier loading changes the total network capacitance, thereby changing the circuit resonant frequency. Generally, removing or adding resistors at higher frequencies can affect the net capacitance of a circuit because parasitic capacitance is either removed or added when the loading is changed and therefore a circuit's frequency of oscillation (tuning) or resonant frequency changes. There is a need in the art, therefore, for a low power RF programmable amplifier that provides gain steps, as necessary, without changing a circuit resonant frequency.

SUMMARY OF THE INVENTION

A circuit is formed to steer current in to and out of an inductive load in a manner that enables an amplifier to provide a plurality of gain steps without modifying an LC time constant for the circuit and, therefore, without modifying the resonant frequency of oscillation for the circuit. More specifically, a first group of Metal Oxide Semiconductor Field Effect Transistors (MOSFETs) are coupled in parallel for providing the amplification for the circuit. The gates for the transistors are coupled to receive the input signal that is to be amplified. A second group of MOSFETs are coupled in parallel to each other and in series to an impedance device. The impedance device, an inductor in the described embodiment of the invention, and the second group of MOSFETs, are coupled in parallel to a third group of MOSFETs. The combination of the impedance device and second group of MOSFETs, and the parallel combination of the third group of MOSFETs, are all coupled serially with the first group of MOSFETs.

Generally, the first group of MOSFETs defines the total current that flows through the combination of the second and third groups of MOSFETs. The transistors in the second and third groups of MOSFETs are selectively activated (biased with a gate to source voltage) to control the amount of current that goes through the impedance device. Because the impedance device is further coupled to an output of the circuitry, the amount of current flowing there through affects the output signal gain. Thus, the first group of MOSFETs effects the amount of current that flows through the circuitry, while the bias settings of the second and third groups of MOSFETs effect the magnitude of the output signal.

The inventive configuration is advantageous in that it provides for the modification of the output gain without modifying the total capacitance of the circuit and, therefore, without modifying the resonant frequency of oscillation of the circuit.

In one embodiment of the present invention, the first group of transistors consists of three MOSFETs, while the second and third groups of MOSFETs each have two selectively biased MOSFETs that may be turned on or off. The second group of MOSFETs further includes a third MOSFET that is biased to a source voltage and, therefore, is always in an operational state. Accordingly, the remaining MOSFETs of the second group of transistors and the transistors of the third group of transistors are selectively biased on or off to control the amount of current flow through the impedance device that is coupled in series with the second group of MOSFETs.

More specifically, each of the selectively biased MOSFETs in the second group of transistors receives a bias signal that is opposite in state to the bias signals of the MOSFETs of the third group of transistors. Accordingly, for each transistor that is turned off in the second group of transistors, one transistor is biased on in the third group of transistors. Oppositely, for each transistor in the second group of transistors that is turned on, one transistor from the third group of transistors is turned off.

Accordingly, in the embodiment here, two selectively biased MOSFETs in each of one second and third groups of transistors, exactly three transistors between the second and third groups of transistors will be on and two will be off, and three transistors in the first group of transistors will be on. Stated differently, one permanently biased transistor, and exactly two selectively biased transistors, will be on at any one time. As such, the amount of current steering, i.e., the amount of current that is conducted through the impedance device, may be controlled by changing the resistive loading of the MOSFETs in series and in parallel with the impedance device in a manner in which the capacitance, as introduced by the operating MOSFETs, does not change. One reason, of course, is that all five of the MOSFETs of the second and third groups of transistors are carefully matched to be within one percent (1%) of each other. It is understood, of course, that different numbers and combinations of transistors may be implemented in the described embodiment of the invention.

Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 2A:
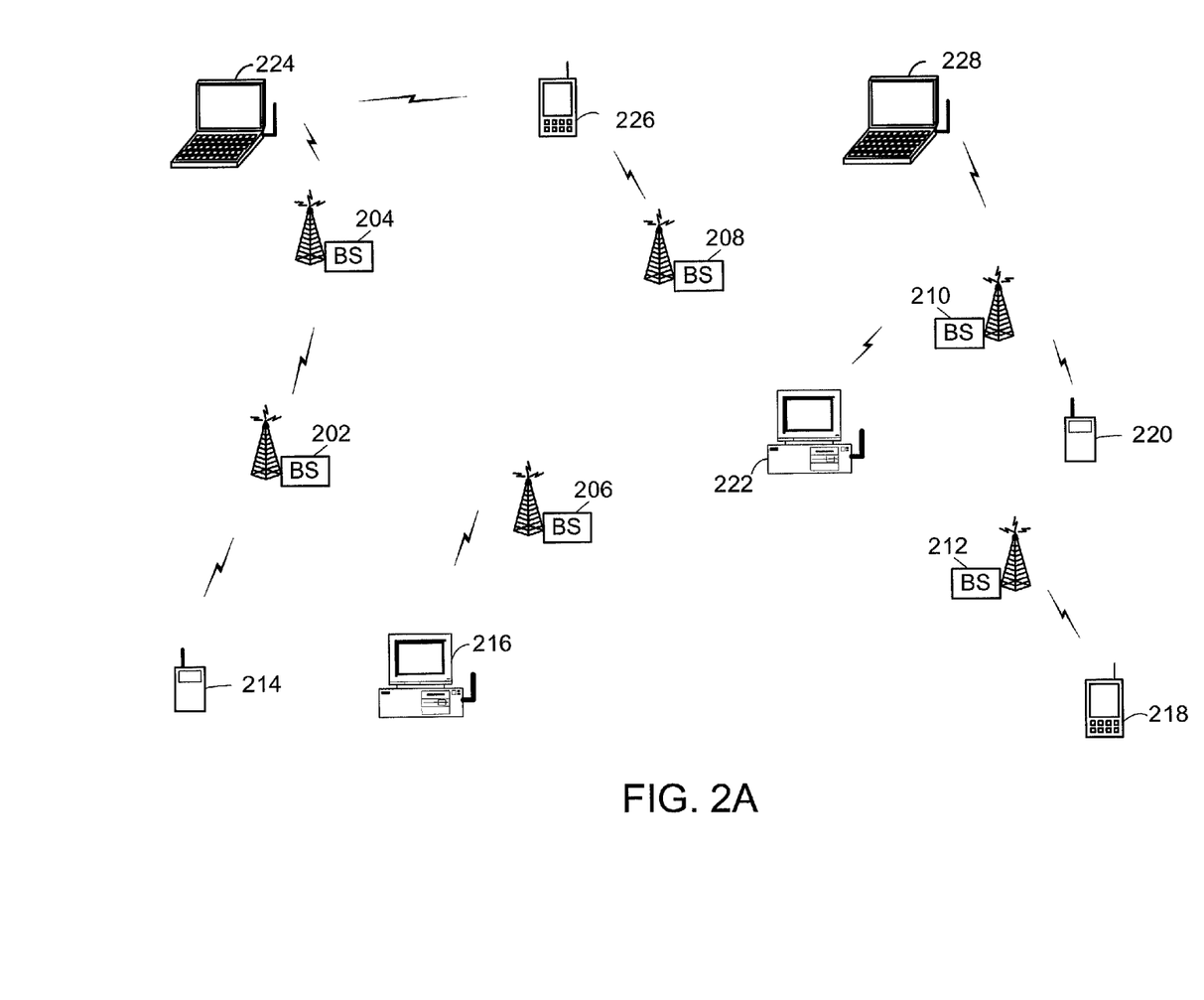
FIG. 2A is a system diagram illustrating a cellular system within which the present invention is deployed.

FIG. 2A is a system diagram illustrating a cellular system within which the present invention is deployed. The cellular system includes a plurality of base stations 202, 204, 206, 208, 210, and 212 that service wireless communications within respective cells, or sectors. The cellular system services wireless communications for a plurality of wireless subscriber units. These wireless subscriber units include wireless handsets 214, 218, 220, and 226, mobile computers 224 and 228, and desktop computers 216 and 222. During normal operations, each of these subscriber units communicates with one or more base stations during handoff among the base stations 202 through 212. Each of the subscriber units 214 through 228 and base stations 202 through 212 include RF circuitry constructed according to the present invention.

The RF circuitry formed according to the present invention may be formed to operate with any one of a number of different protocols and networks. For example, the network of FIG. 2A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth transceiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 2A. For example, wireless networks that comport with service premises-based Wireless Local Area Network (WLAN) communications, e.g., IEEE 802.11 a and IEEE 802.11b communications, and ad-hoc peer-to-peer communications, e.g., Bluetooth (as described above). In a WLAN system, the structure would be similar to that shown in FIG. 2A, but, instead of base stations 202 through 212, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF transceiver of the present invention would support communications between peer devices, e.g., mobile computer 224 and wireless handset device 226. The fast growth of the mobile communications market and for networks as shown in FIG. 2A require the development of multi-band RF transceivers that are small in size, low in cost, and have low power consumption. These RF transceivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses Gaussian Frequency Shift Keyed (GFSK) modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on Binary Phase Shift Keyed (BPSK) and Quadrature Phase Shift Keyed (QPSK) constellations at 11 Mbits/s. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 2A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 214 through 228, base stations 202 through 212 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receive and transmission circuitry that have full functionality while meeting these lower power constraints and while providing good signal quality. The system of FIGS. 2A and 2B include the inventive gain switch circuitry disclosed herein.

Figure 2B:
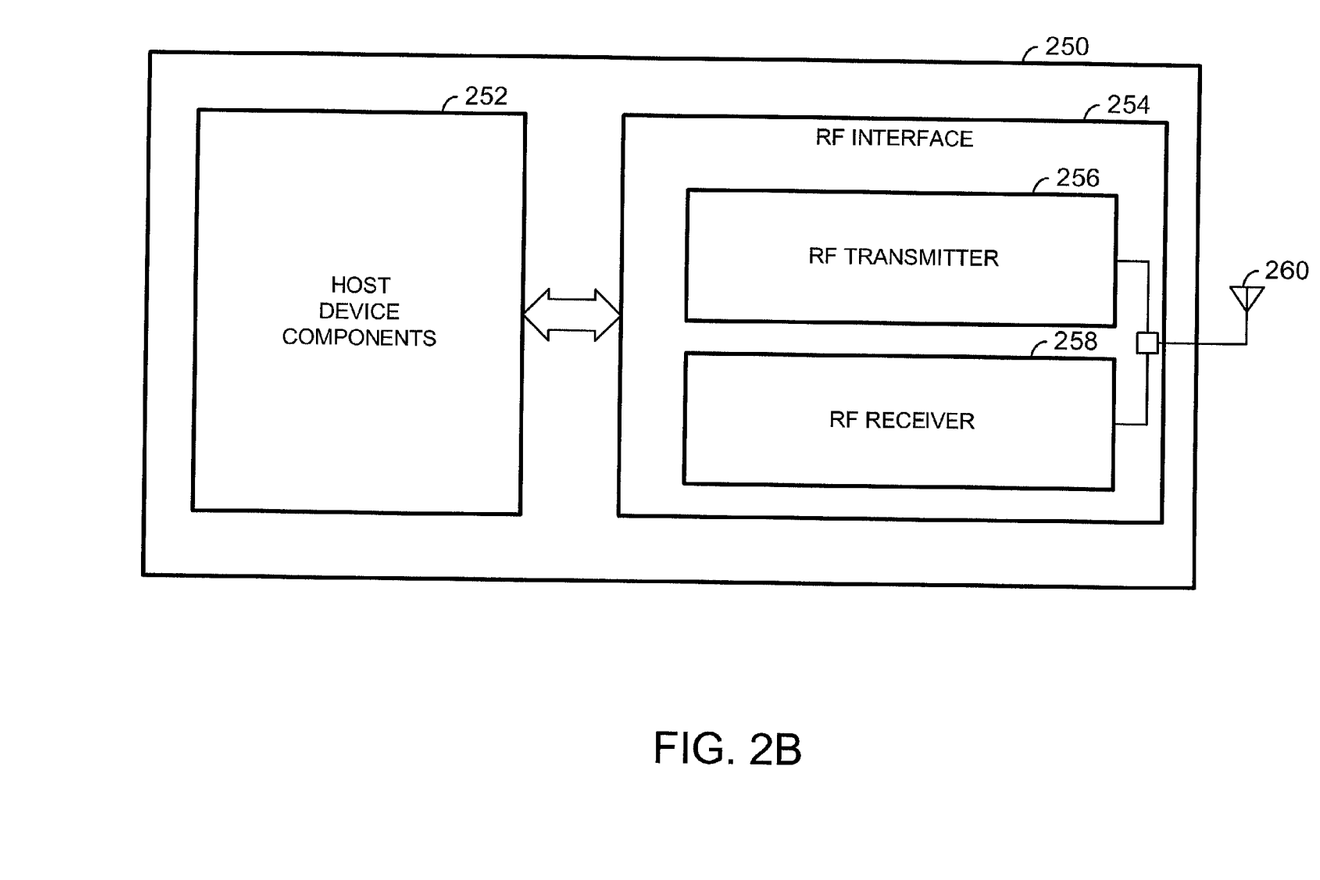
FIG. 2B is a block diagram generally illustrating the structure of a wireless device constructed according to the present invention.

FIG. 2B is a block diagram generally illustrating the structure of a wireless device 250 constructed according to the present invention. The general structure of wireless device 250 will be present in any of wireless devices 214 through 228 illustrated in FIG. 2A. Wireless device 250 includes a plurality of host device components 252 that service all requirements of wireless device 250 except for the RF requirements of wireless device 250. Of course, operations relating to the RF communications of wireless device 250 will be partially performed by host device components 252.

Coupled to host device components 252 is a Radio Frequency (RF) interface 254. RF interface 254 services the RF communications of wireless device 250 and includes an RF transmitter 256 and an RF receiver 258. RF transmitter 256 and RF receiver 258 both couple to an antenna 260. One particular structure of a wireless device is described with reference to FIG. 2. Further, the teachings of the present invention are embodied within RF transmitter 256 of RF interface 254. In general, however, the radio receiver of the present invention includes circuitry for receiving and interpreting constant modulation format signals. Additionally, the circuit portion that receives and interprets the RF includes LNA gain switch circuitry formed according to the present invention so that the received signals may be amplified to specified levels with accuracy. Thus, the inventive circuitry includes LNA gain switch circuitry that provides stable gain measurements that are used to generate gain level control signals for one of the radio amplifiers (e.g., a low noise amplifier at the input of the radio as in the described embodiment of the invention or another amplifier such as a programmable gain amplifier that is typically coupled downstream from mixing and filtering circuitry but prior to baseband processing circuitry).

Figure 3:
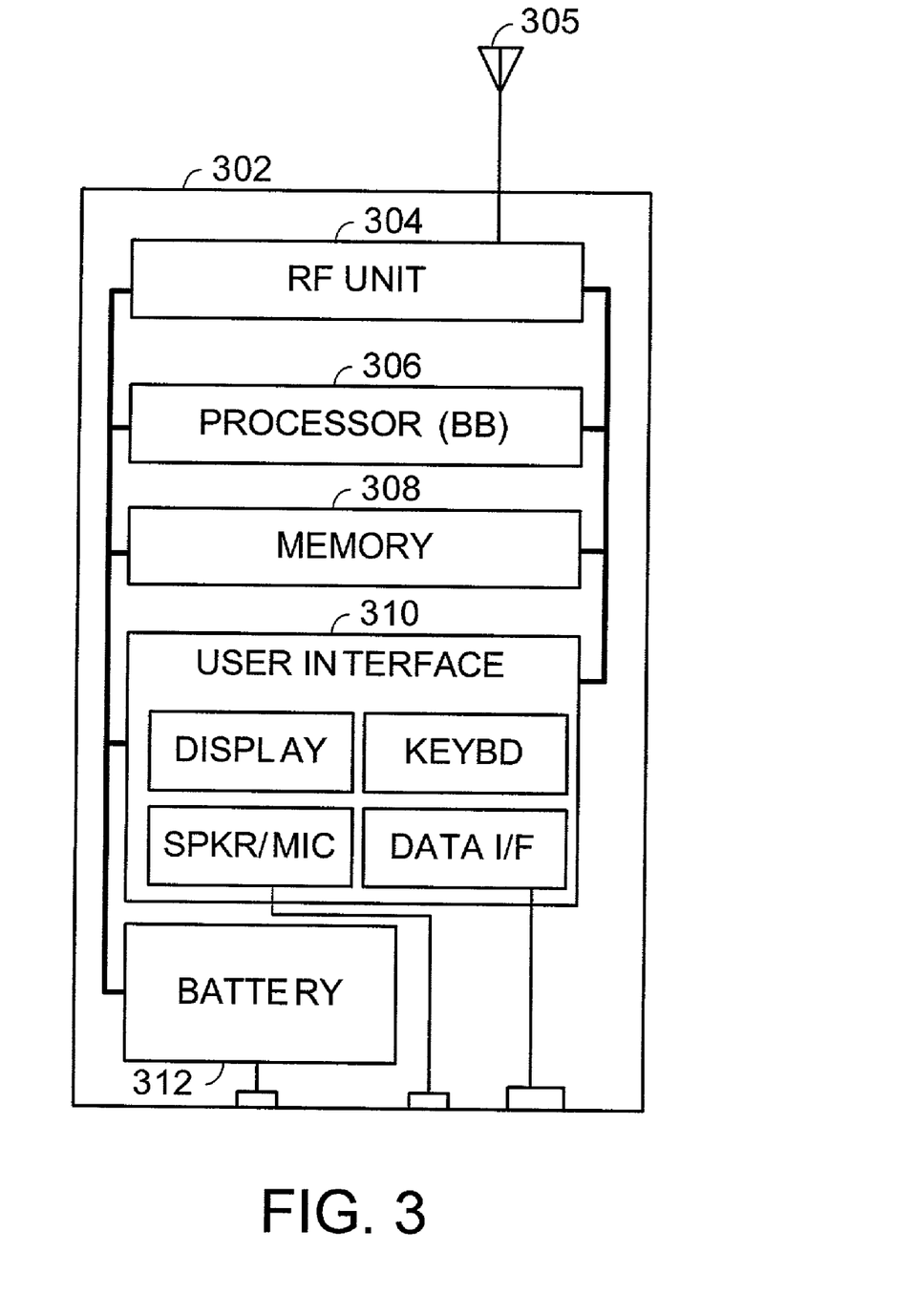
FIG. 3 is a block diagram illustrating a subscriber unit constructed according to the present invention.

FIG. 3 is a block diagram illustrating a subscriber unit 302 constructed according to the present invention. Subscriber unit 302 operates within a cellular system, such as the cellular system described with reference to FIG. 2A. Subscriber unit 302 includes an RF unit 304, a processor 306 that performs baseband processing and other processing operations, and a memory 308. RF unit 304 couples to an antenna 305 that may be located internal or external to the case of subscriber unit 302. Processor 306 may be an Application Specific Integrated Circuit (ASIC) or another type of processor that is capable of operating subscriber unit 302 according to the present invention. Memory 308 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 308 may be partially or fully contained upon an ASIC that also includes processor 306. A user interface 310 includes a display, a keyboard, a speaker, a microphone, and a data interface, and may include other user interface components, as well. RF unit 304, processor 306, memory 308, and user interface 310 couple via one or more communication buses or links. A battery 312 is coupled to, and powers, RF unit 304, processor 306, memory 308, and user interface 310.

RF unit 304 includes the LNA gain switch circuitry as described herein. The structure of subscriber unit 302, as illustrated, is only one particular example of a subscriber unit structure. Many other varied subscriber unit structures could be operated according to the teachings of the present invention. Further, the principles of the present invention may be applied to base stations, as are generally described with reference to FIG. 2A.

Figure 4:
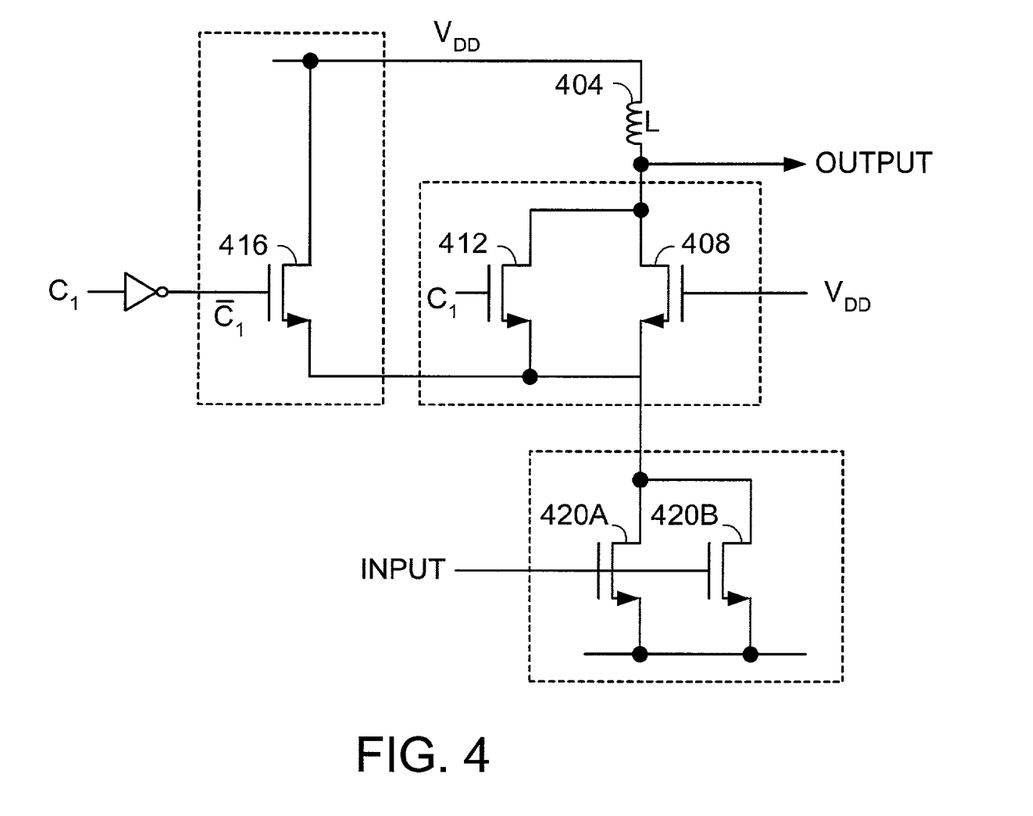
FIG. 4 is a functional schematic diagram that illustrates one embodiment of the present invention.

FIG. 4 is a functional schematic diagram that illustrates one embodiment of the present invention. As may be seen, an impedance device, here an inductive load 404, is coupled in series with a pair of MOSFETs 408 and 412. As may be seen, MOSFETs 408 and 412 are coupled in parallel. Additionally, the series combination of inductive load 404 and MOSFETs 408 and 412 are coupled in parallel to a MOSFET 416.

The described circuitry is further coupled in series with a pair of amplification MOSFETs 420A and 420B. The gates of amplification MOSFETs 420A and 420B are coupled to receive an input signal that is to be amplified, while the gate of MOSFET 408 is coupled to a voltage source, for example, $V_{DD}$. The gates of MOSFETs 412 and 416, however, are coupled to receive opposite states of a control logic signal $C_1$. Accordingly, one of the two MOSFETs 412 and 416 will be biased to the on position, while the other is biased to the off position.

In operation, MOSFET 408 is always biased on and acts as a resistive load in series with inductive load 404. The output node of the circuit is the node between inductive load 404 and MOSFET 408. Accordingly, if MOSFET 416 is turned off, meaning that MOSFET 412 is turned on, then all of the current from $V_{DD}$ to ground that flows through amplification MOSFETs 420A and 420B will also flow through inductive load 404 and through the parallel combination of MOSFETs 408 and 412. This configuration maximizes the output voltage at the node between inductive load 404 and MOSFET 408 as it maximizes the current flowing through the inductive load 404. However, if $C_1$, the control signal for MOSFETs 412 and 416, is set to 0, then the gate voltage for MOSFET 416 is biased high (due to the inverter), thereby turning on MOSFET 416 and turning off MOSFET 412. Here, half of the current that flows through amplification MOSFETs 420A and 420B will continue to flow through MOSFET 408 and inductive load 404, while approximately half of the current flows through MOSFET 416. Accordingly, as may be seen, the output signal is steered in to and out of inductive load 404 thereby modifying the output at the defined output node. An advantage of the configuration of FIG. 4 is that a constant number of nearly identical MOSFET are kept on at any instant. Thus, the capacitance introduced by the MOSFETs remains constant and the output load remains constant as the amplifier gain is being modified.

In the example of FIG. 4, the number of transistors in parallel to MOSFET 408 is equal to "n", where "n minus 1" is the desired number of gain steps. The number of transistors, therefore, that are coupled in parallel to inductive load 404 and MOSFETs 408 and 412 also is equal to "n". The number of transistors that are coupled to receive the input signal, however, is equal to "n+1" which, in the example shown, is equal to 2. Only one transistor is shown in parallel with MOSFET 408 and only one transistor is shown in parallel with the combination of inductive load 404 and MOSFETs 408 and 412. However, as may be seen, two MOSFETs are coupled to receive the input signal. It is understood, however, that "n" represents one more transistors and a reference to MOSFET 412 or 416 is a reference to "n" transistors.

The circuit of FIG. 4, therefore, is advantageous in that amplification MOSFETs 420A and 420B receive the input signal and determine the amount of current that flows through MOSFETs 408, 412 and 416. The current that flows through amplification MOSFETs 420A and 420B flows through either MOSFETs 412 or 416, according to which one is biased on, and through MOSFET 408. Thus, an approximately equal amount of current flows through each of the MOSFETs 420A and 420B that flows through each of the MOSFETs 408 and 412 or 416 according to which one is biased on.

Figure 5:
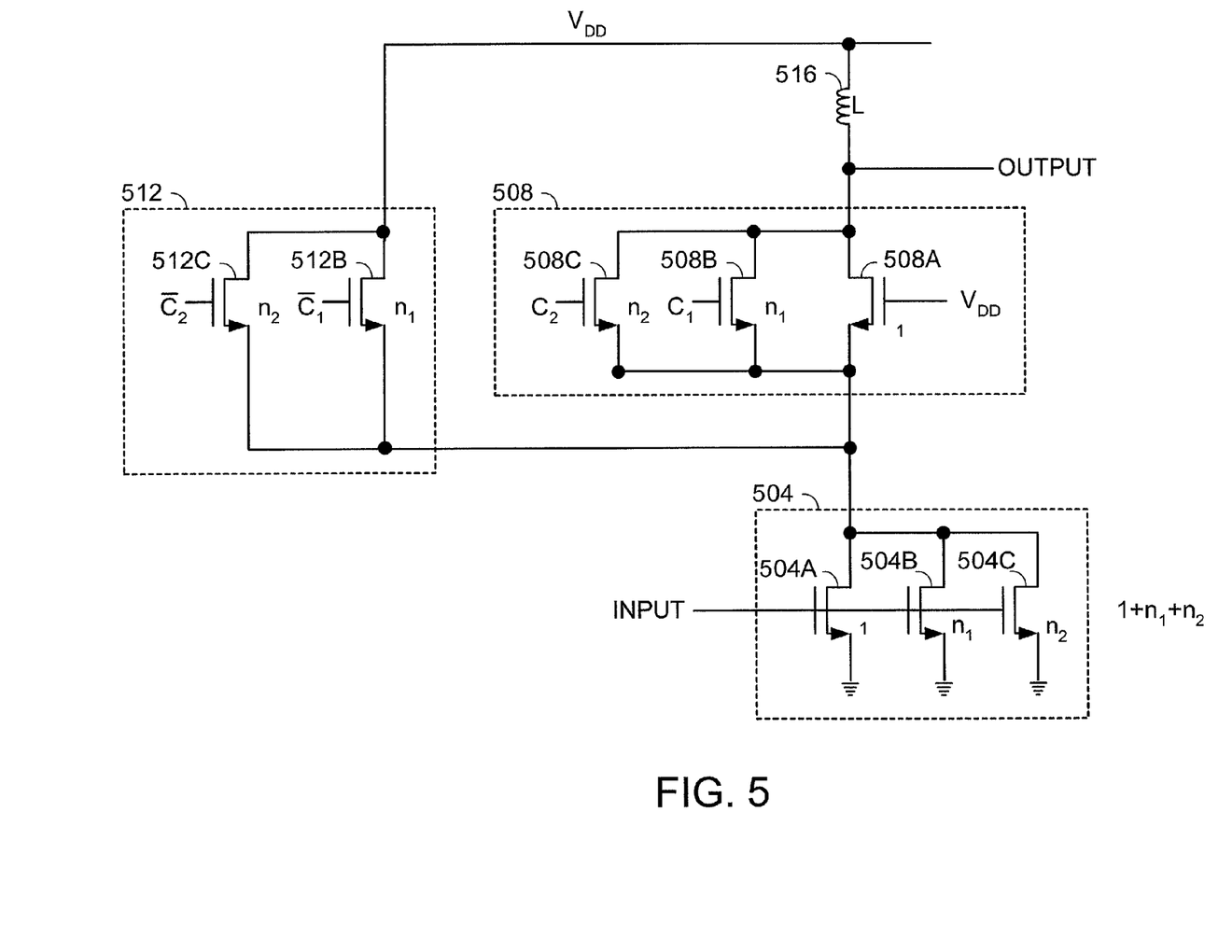
FIG. 5 is a functional schematic diagram that illustrates another embodiment of the described invention.

FIG. 5 is a functional schematic diagram that illustrates another embodiment of the described invention. A first group of MOSFETs 504 include a plurality of matched MOSFETs 504A, 504B and 504C, wherein the number of transistors matches the number of gain steps desired. More specifically, the number of transistors within the first group of MOSFETs 504 is equal to "$1+n_1+n_2$" in which "$n_1$" and "$n_2$" reflect that a number of transistors may be used in place of the one that is shown.

A second group of MOSFETs 508 also include a plurality of MOSFETs 508A, 508B and 508C. More specifically, the number of transistors of the second group of MOSFETs 508 is equal to "$1+n_1+n_2$." A third group of MOSFETs 512 includes "$n_1+n_2$" transistors shown here in FIG. 5 as 512B and 512C. As may be seen, the source of each of the transistors of the second and third groups of MOSFETs 508 and 512 are coupled to a common node with the transistors of the first group of MOSFETs 504. The drains of the second group of MOSFETs 508 are coupled to an output node and also to one end of an inductor 516. In the described embodiment, inductor 516 is an inductive load, although other impedance load devices maybe used.

The drains of the transistors of the third group of MOSFETs 512 are merely coupled to a voltage source, here, $V_{DD}$, and to a second end of inductor 516. Effectively, the third group of transistors is coupled in parallel to the series combination of inductor 516 and the second group of MOSFETs 508. Both the second and third groups of transistors are coupled in series within the first group of transistors.

As was stated before, the first group of transistors has a total number of "$1+n_1+n_2$" transistors. This number reflects the number of desired amplifier gain stages. This number also reflects the number of transistors that are operationally biased at any given instant given the biasing logic of the transistors in the second and third groups of transistors. More specifically, for each of the $n_1$ MOSFETs 508B of the second group of MOSFETs 508, there is an equal number of $n_1$ MOSFETs 512B of the third group of MOSFETs 512. However, MOSFETs 508B are biased with a signal that is the logical opposite of the biasing signal for the group of MOSFETs 512B. Similarly, for each of the $n_2$ MOSFETs 508C of the second group of MOSFETs 508, there is an equivalent number of $n_2$ MOSFETs 512C of the third group of MOSFETs 512. The MOSFETs 508C are biased with a logically opposite signal to that of the group of MOSFETs 512C so that at any one time only the $n_2$ transistors of the second group of MOSFETs 508, or the $n_2$ transistors of the third group of MOSFETs 512, are biased on.

According to the biasing signals $C_1$ and $C_2$, current is steered into or out of the impedance device, here inductor 516. Because MOSFET 508A is always biased by a supply voltage $V_{DD}$, MOSFET 508A is always on. If $C_1$ and $C_2$ are biased to a logic 1, all of the current being drawn by the first group of MOSFETs 504 is conducted through each of the transistors of the second group of MOSFETs 508, thereby maximizing the voltage drop across inductor 516. According to the logic setting of $C_1$ and $C_2$ and the number of transistors forming $n_1$ and $n_2$, the steps in the gain size may be controlled at the output shown here in FIG. 5. For example, if $n_1$ is equal to 2 and $n_2$ is equal to 4, then each of the first and second groups of MOSFETs 504 and 508, respectively, include seven transistors total. If $C_2$, in this example, is biased to logic 0, then $3/7^{th}$ of the current is propagated through inductor 516 and $4/7^{th}$ of the current is propagated through the third group of MOSFETs 512. Accordingly, the reduction in current through inductor 516 reduces the voltage drop across inductor 516 and, therefore, the output signal magnitude.

Regardless of the logic settings of $C_1$ and $C_2$, there are always exactly 14 transistors that are biased and operational at any given instant. For the example described herein, wherein $n_2$ is equal to 4 transistors and $n_1$ is equal to 2 transistors, if $C_1$ and $C_2$ are both a logic 0, MOSFET 508A is always biased on and, therefore, $1/7^{th}$ of the signal is applied thereto. In that case, $6/7^{th}$ of the signal is applied to the 6 transistors of the third group of MOSFETs 512.

FIG. 5 illustrates that signal step sizes may be varied in a non-linear manner. Additionally, because a constant number of transistors are always biased on, parasitic capacitance that is introduced by the MOSFETs remain constant, thereby enabling the tuning of the circuit of FIG. 5 to remain constant. Additionally, it is understood that additional groups of transistors may be included in the described manner to increase the number of gain settings or steps. Finally, the example herein assumes a constant biasing voltage thereby causing a constant effective resistance since the MOSFETs are biased in the linear (non-saturated) region. Alternatively, the effective resistance and, therefore, current steering, may be provided by changing the bias voltage on the gate terminal while the MOSFETs are operating in the linear region.

Figure 6:
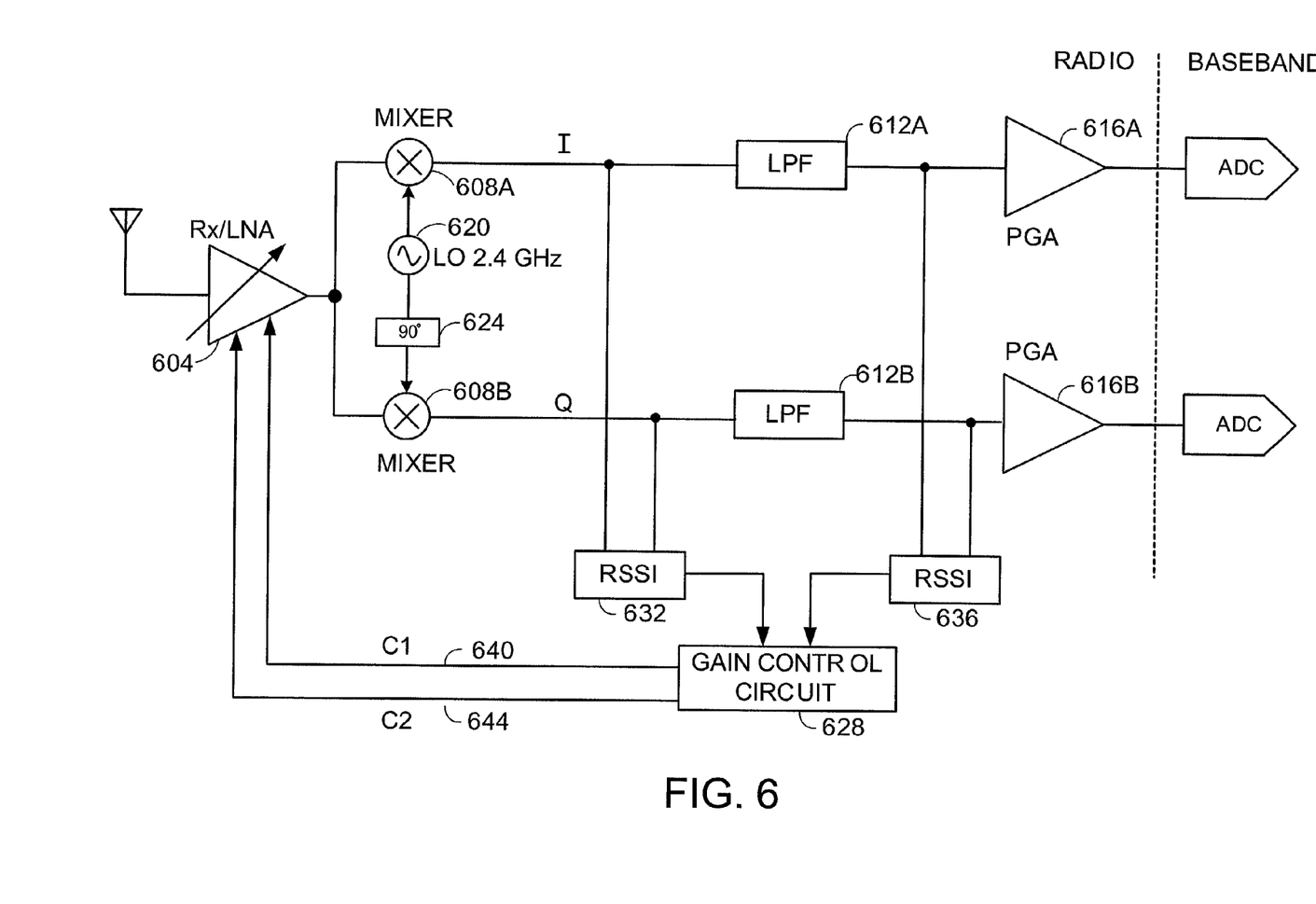
FIG. 6 is a functional schematic block diagram of an RF processing unit of a radio transceiver formed according to one embodiment of the present invention.

FIG. 6 is a functional schematic block diagram of an RF processing unit of a radio transceiver formed according to one embodiment of the present invention. An RF receiver unit includes a receiver/low noise amplifier (LNA) 604 that is coupled to receive wireless radio communications by way of an antenna. As is known by those of average skill in the art, radio communications typically employ one of many different modulation techniques, including QPSK, et al. Accordingly, receiver/LNA 604 produces an amplified signal containing I and Q modulated channels to mixers 608A and 608B for separation into the I and Q modulated channels. In the described embodiment of the invention, the radio transceiver is formed to satisfy 802.11b design requirements. Accordingly, at any time, the RF input signal is centered on a particular RF channel within the 2.4 GHz carrier frequency band. The RF input signal then is down converted to a baseband signal.

The mixers 608A and 608B both receive the RF input signal from receiver/LNA 604. Mixers 608A and 608B also receive I and Q phases, respectively, of an LO signal having a specified frequency component from phase-locked loop circuit 620. Mixer 608B, as may be seen, receives the Q phase of the LO signal from a local oscillator 620 by way of a phase shift circuit 624 that provides a 90° phase shift to the LO signal. Accordingly, mixer 608B produces the Q component of the baseband signal, while mixer 608A produces the I component of the baseband signal. Thereafter, mixers 608A and 608B provide the I and Q components of baseband signal to low pass filters 612A and 612B for the I and Q modulated channels, respectively.

As is known, low pass filters 612A and 612B are for blocking all communication signals above a specified frequency. The outputs of low pass filters 612A and 612B are then produced to programmable gain amplifiers (PGAs) 616A and 616B. Additionally, a gain control circuit 628 receives signal strength indications from received signal strength indicator (RSSI) circuits 632 and 636. RSSI 632 produces a signal strength indication for a wide band signal (signal plus interference) for an amplified signal received from an input node of the filters 612A and 612B. RSSI 636 produces a signal strength indication from an output node of filters 616A and 616B. Accordingly, gain control circuit implements logic to set a gain level for the received/LAN 604 according to the relative strengths of the outputs of RSSIs 632 and 636. As may be seen, in the described embodiment of the invention, gain control circuit 628 produces two logic signals C1 and C2 on lines 640 and 644, respectively, that serve to operatively bias MOSFETs within the receiver/LNA as described herein. Finally, in the described embodiment, the analog-to-digital converters (ADCs) are within the baseband processing circuitry external to the IF radio integrated circuit.

In operation, the low noise amplifier from the receiver portion of a radio transceiver, receives a wireless communication signal from an antenna and amplifies the signal, as well as separate it, into the I and Q channels of the circuitry (in QPSK systems). For the sake of simplicity, the I channel will be described herein. The communication signals on the I channel are then produced to mixer 608A that adjusts the frequency of the received signals or communication channel to a specified frequency. Here, because the receiver is an 802.11b receiver, the frequency channel for the received RF signals is centered about 2.4 GHz. Thereafter, the signal is down converted to a baseband channel that is approximate to DC (e.g., 5 MHz) relative to the received RF. The baseband channel is then produced to low pass filter 612A that defines an upper corner frequency and filters (attenuates) all signals above that frequency.

Each of the circuit elements of the radio receiver in this path thus far, namely, receiver/LNA 604, mixer 608A, and low pass filter 612A, add gain to the received signals. Because the gain of the received signal can vary dramatically, however, the gain of the LNA programmable gain amplifier is adjusted so that the gain of the output signal being provided to the baseband radio circuitry is of a constant level. Unfortunately, many common LNA programmable gain amplifiers provide a very limited number of amplification steps, if any. Moreover, those that do provide for gain steps often change the resonant frequency of the circuit, changing the circuit's total capacitance by at least a small amount whenever the MOSFETs biased to act as resistors are switched in and out of the circuit.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A method for adjusting a gain output in an amplifier, comprising:

conducting current through an output inductive load device and through a number of branches of a first circuit portion operatively coupled downstream of the inductive output load device;

selectively conducting current either through a second number of branches of a second circuit portion to increase an output gain by increasing current through the output inductive load device based upon a first logic state of a control signal or to decrease the output gain by decreasing current through the output inductive load device by increasing current conducted through the second number of branches of a third circuit portion based upon a second logic state of the control signal; and wherein a number of branches of the first circuit portion is always equal to a number of branches in the second and third branches that are conducting current and further wherein a frequency response defined at least in part by the output inductive load device and parasitic capacitance of MOSFET devices used to adjust the output gain remains substantially constant.

2. The method of claim 1 wherein a number of total branches in the second circuit portion is equal a number of total branches of the third circuit portion plus one.

3. The method of claim 2 further including applying a selective logic zero bias to a branch MOSFET in the third circuit portion for every branch in the second circuit portion for which a selective logic one bias is applied to a branch MOSFET.

4. The method of claim 2 further including applying a selective logic one bias to a branch MOSFET in the third circuit portion for every branch MOSFET in the second circuit portion for which a selective logic zero bias is applied.

5. The method of claim 1 wherein current is selectively conducted through any and all of the branches of the third number of branches by selectively biasing a branch MOSFET therein with a logic one and a corresponding branch MOSFET of the second number of branches with a logic zero.

6. The method of claim 5 wherein a total capacitance for the second number of branches and the third number of branches remains approximately constant whenever a biasing change is made to a branch MOSFET of each of the branches in the third number of branches and the corresponding branch MOSFET of the second number of branches.

7. A low noise amplifier having selectable gain levels formed within an integrated circuit, comprising:
   2*n1 total selectable branches in a first and second portion of an integrated circuit;
   2*n2 total selectable branches in the first and second portions of the integrated circuit;
   a load device coupled in series with the first portion of the circuit wherein the load device and the first portion of the integrated circuit collectively are coupled in parallel with the second portion of the integrated circuit; and
   logic circuitry for selecting which of the 2*n1 and 2*n2 selectable branches are to conduct current and correspondingly, the amount of current flow through the load device wherein the output level of the amplifier formed within the integrated circuit corresponds to the amount of current in the load device.

8. The amplifier of claim 7 wherein the first and second portions contain 2*n1 and 2*n2 selectable branches and wherein the first portion further comprises one permanently selected branch.

9. The amplifier of claim 8 wherein n1 is equal to n2 and further wherein gain step sizes are approximately equal.

10. The amplifier of claim 8 wherein n1 is not equal to n2 and further wherein gain step sizes are not equal to each other.

11. The amplifier of claim 8 wherein the n1 branches are selected by a first logic signal and wherein the n2 branches are selected by a second logic signal.

12. A method for varying an amplifier output gain level, comprising:
   generating a first logic signal having a first logic state and producing the first logic signal to a first group of selectable MOSFETs;
   generating a second logic signal having either the first logic state or a second logic state and producing the second logic signal to a second group of selectable MOSFETs;
   generating a third logic signal having a logic state that is opposite of the first logic signal and producing the third logic signal to a third group of MOSFETs;
   generating a fourth logic signal having a logic state that is opposite of the second logic signal and producing the fourth logic signal to a fourth group of MOSFETs;
   conducting an amount of current through an inductive load wherein:
   a maximum amount of current is conducted if the first and second groups of MOSFETs receive the first and second logic signals being set to the first logic state at their gate terminals, respectively; and
   a minimum amount of current is conducted if the first and second groups of MOSFETs receive the first and second logic signals being set to the second logic state at their gate terminals, respectively.

13. The method of claim 12 wherein the amount of current is less than the maximum and more than the minimum and further wherein the first group and second groups of MOSFETs receive the logic signals having having opposites states relative to each other.

14. The method of claim 13 wherein the amount of current depends, in part, on the number of MOSFETs in each of the first and second groups of MOSFETs.

15. The method of claim 14 wherein the MOSFETs of each of the first, second, third and fourth groups of MOSFETs are matched.

16. The method of claim 15 wherein the first and third groups of MOSFETs have an equal number of MOSFETs relative to each other.

17. The method of claim 15 wherein the second and fourth groups of MOSFETs have an equal number of MOSFETs relative to each other.

18. The method of claim 15 wherein the first, second, third and fourth groups of MOSFETs have an equal number of MOSFETs relative to each other.

19. A method for adjusting a gain output in an amplifier, comprising:
   conducting current through an output inductive load device to generate an output signal wherein an output frequency response is defined at least in part by the inductive load device and parasitic capacitance of active devices operatively coupled to the output inductive load device which active devices are operable to adjust a gain of the output signal;
   in a first mode, conducting a portion of the current away from the output inductive load device based upon a first control signal logic state;
   in a second mode, conducting the portion of the current through the output inductive load device based upon a second control signal logic state wherein the second control signal logic state is opposite of the first control signal logic state;
   operatively biasing a gain step MOSFET transistor coupled in series with the output inductive load device into an operational state to conduct the portion of the current through the output load device; and
   operatively turning off a current steering MOSFET transistor coupled across the output inductive load device to cause the current steering MOSFET to substantially stop conducting the portion of the current away from the output inductive load device.

20. The method of claim 19 further including biasing a plurality of gain step MOSFETs within a second circuit portion.

21. The method of claim 19 further including operative turning off a plurality of current steering MOSFETs of a third circuit portion wherein a number of total branches in the second circuit portion is equal a number of total branches of the third circuit portion plus one.

22. The method of claim 19 further including applying a selective logic zero bias to a branch MOSFET in the third circuit portion for every branch in the second circuit portion for which a selective logic one bias is applied to a branch MOSFET of the second circuit portion.

23. The method of claim 21 further including applying a selective logic one bias to a branch MOSFET in the third circuit portion for every branch in the second circuit portion for which a selective logic zero bias is applied to a branch MOSFET of the second circuit portion.

24. The method of claim 19 wherein current is selectively conducted through any and all of the branches of the third number of branches by selectively biasing a branch MOSFET therein with a logic one and a corresponding branch MOSFET of the second number of branches with a logic zero.

25. The method of claim 24 wherein a total capacitance for the second number of branches and the third number of branches remains approximately constant whenever a biasing change is made to a branch MOSFET of each of the branches in the third number of branches and the corresponding branch MOSFET of the second number of branches.

* * * * *